(12) United States Patent
Arai

(10) Patent No.: US 7,498,239 B2
(45) Date of Patent: *Mar. 3, 2009

(54) WAFER PROCESSING METHOD

(75) Inventor: Kazuhisa Arai, Tokyo (JP)

(73) Assignee: Disco Corporation, Tokyo (JP)

( * ) Notice: Subject to any disclaimer, the term of this patent is extended or adjusted under 35 U.S.C. 154(b) by 381 days.

This patent is subject to a terminal disclaimer.

(21) Appl. No.: 11/092,756

(22) Filed: Mar. 30, 2005

(65) Prior Publication Data
US 2005/0221584 A1 Oct. 6, 2005

(30) Foreign Application Priority Data
Apr. 1, 2004 (JP) ............................. 2004-108965

(51) Int. Cl.
H01L 21/00 (2006.01)
H01L 21/68 (2006.01)
H01L 21/683 (2006.01)
H01L 21/687 (2006.01)

(52) U.S. Cl. ..................... 438/464; 438/455; 438/458; 438/459; 438/460; 438/462

(58) Field of Classification Search ................ 438/455, 438/14–18, 458, 459, 460, 462, 464; 257/E21.224, 257/E21.237
See application file for complete search history.

(56) References Cited

U.S. PATENT DOCUMENTS

| | | | | |
|---|---|---|---|---|
| 6,096,433 | A * | 8/2000 | Kikuchi et al. | 428/446 |
| 6,284,093 | B1 * | 9/2001 | Ke et al. | 156/345.51 |
| 6,331,449 | B1 * | 12/2001 | Ohsumi | 438/113 |
| 6,479,410 | B2 * | 11/2002 | Shiota et al. | 438/788 |
| 6,638,865 | B2 * | 10/2003 | Tanaka | 438/692 |
| 6,639,327 | B2 * | 10/2003 | Momoi et al. | 257/131 |
| 6,712,111 | B2 * | 3/2004 | Tokunaga et al. | 156/510 |
| 6,837,776 | B2 * | 1/2005 | Shimobeppu et al. | 451/41 |
| 6,905,946 | B2 * | 6/2005 | Grigg et al. | 438/459 |
| 7,115,485 | B2 * | 10/2006 | Priewasser | 438/464 |
| 2002/0016047 | A1 * | 2/2002 | Tateishi | 438/462 |
| 2002/0187647 | A1 * | 12/2002 | Dhindsa et al. | 438/710 |
| 2003/0113984 | A1 * | 6/2003 | Okada et al. | 438/459 |
| 2003/0189439 | A1 * | 10/2003 | Kohno et al. | 324/754 |
| 2004/0084755 | A1 * | 5/2004 | Nguyen et al. | 257/620 |
| 2004/0097084 | A1 * | 5/2004 | Fukuda et al. | 438/690 |
| 2004/0187791 | A1 * | 9/2004 | Busse et al. | 118/728 |
| 2004/0259332 | A1 * | 12/2004 | Fukuoka et al. | 438/464 |

(Continued)

FOREIGN PATENT DOCUMENTS

JP 2003-209083 7/2003

(Continued)

*Primary Examiner*—W. Wilczewski
*Assistant Examiner*—Latanya Crawford
(74) *Attorney, Agent, or Firm*—Wenderoth, Lind & Ponack, L.L.P.

(57) ABSTRACT

A wafer processing method is capable of easily handling even a thinly formed wafer during the processing thereof. An annular protective member is bonded to an outer circumferential excess region on an outer surface of the wafer, on which devices are not formed, and a rear surface is ground with the outer surface left in the mentioned condition. Since the outer circumference of the wafer is reinforced with the annular protective member, the handling of the wafer becomes easy even after the wafer becomes thinner due to a grinding operation.

13 Claims, 8 Drawing Sheets

U.S. PATENT DOCUMENTS

2005/0037541 A1* 2/2005 Nagasawa et al. ............ 438/113
2005/0064683 A1* 3/2005 Farnworth et al. ........... 438/464
2005/0255674 A1* 11/2005 Nanjo ......................... 438/460
2006/0166464 A1* 7/2006 Jakob et al. ................. 438/460
2008/0076329 A1* 3/2008 Sekiya et al. ................. 451/41

FOREIGN PATENT DOCUMENTS

JP          2004-022634          1/2004

* cited by examiner

WAFER PROCESSING METHOD

BACKGROUND OF THE INVENTION

1. Field of the Invention

The present invention relates to a wafer processing method used to facilitate the handling of a thinly formed wafer.

2. Related Art

A wafer having a plurality of devices such as IC and LSI formed on its surface is divided into parts of the devices individually by using a dicing unit, and the resultant devices are widely used by being incorporated into various kinds of electronic equipment. In order to reduce the dimensions and weight of the electronic equipment, the wafer not yet divided into parts corresponding to the individual devices is ground at a rear surface thereof, and the thickness of the wafer is set to, for example, 100 μm to 50 μm.

When the wafer becomes thin due to the grinding operation therefor, the rigidity of the wafer is lost, so that the handling of the wafer in a later step becomes difficult. For example, coating the rear surface of the wafer for conducting a probe test on the wafer with a metal film of gold, silver and titanium becomes difficult. Therefore, it becomes difficult to conduct an electric test on the devices. Techniques for grinding the rear surface of the wafer with a support member bonded to the outer surface thereof have also been proposed (for example, refer to JP-A-2004-22634 and JP-A-2003-209083).

However, when a support member is bonded to the outer surface of the wafer, it becomes necessary to peel off the same later, and, even after the support member is peeled off, the adhesive agent remains in some cases on the devices formed on the outer surface of the wafer. In order to completely remove the adhesive agent, a troublesome operation is needed. The handling of the wafer becomes difficult in this respect as well.

SUMMARY OF THE INVENTION

An object of the present invention is to stably support a wafer which becomes thinner by a grinding operation applied thereto, make troublesome work unnecessary, and facilitate the handling of the wafer during a later processing thereof.

For achieving the above object, the present invention provides a method of processing a rear surface of a wafer having an outer (front) surface which is made of a region on which a plurality of devices are formed, and an outer circumferential excess region surrounding the device region. The method includes at least a step of bonding an annular protective member to the outer circumferential excess region, and a step of grinding the rear surface of the wafer while retaining the outer (front) surface of the wafer, to which the annular protective member is bonded, on a chuck table of a grinding device.

In the protective member bonding step, it is preferable that the outer circumferential excess region and annular protective member be bonded together in one body without using any adhesive agent. The bonding without using any adhesive agent includes an anodic bonding, a SOI bonding, a covalent bonding and the like.

After the rear surface grinding step is carried out, a step of forming a film on the rear surface of the wafer to the outer surface of which the annular protective member is bonded, and a step of conducting a probe test on the devices may be carried out in some cases. Furthermore, a step of dividing the wafer into parts of the devices individually may be included in some cases. When the wafer dividing step is carried out, a step of cutting the wafer along an inner circumference of the annular protecting member and separating the outer circumferential excess region from the device region may be carried out beforehand in some cases.

The annular protective member is preferably formed out of a combination of glass, silicon and a ceramic material but the materials are not limited thereto.

According to the present invention, an annular protective member is bonded to an outer circumferential excess region of an outer (front) surface of a wafer. A rear surface of the wafer is then ground while the wafer is retained. Therefore, a grinding operation can be carried out and the device region is protected even though an adhesive agent has not been deposited on the device region of the outer (front) surface. Since a later step is carried out with the wafer made thinner due to a grinding operation applied thereto combined in one body with the annular protective member, the handling of even a wafer the rigidity of which is lost can be done easily. Since no material, and particularly, no adhesive agent, is bonded or deposited on the device region, an adhesive agent removing step is not necessary to be carried out later. Therefore, the handling of the wafer in a later step becomes easy in this respect as well.

The annular protective member is bonded together with the wafer to form one body without using any adhesive agent. Therefore, even when the rear surface of the wafer is exposed to a high temperature of, for example, not lower than 350° C. during the coating of the rear surface with a metal film, the rear surface sufficiently withstands such a temperature, and the forming of a metal film can be done smoothly. Any one of the anodic bonding, SOI bonding and covalent bonding is used as the bonding process without using any adhesive agent, i.e., a suitable bonding method can be selectively used in accordance with the materials of the wafer and annular protective member. When a metal film can be formed on the rear surface of the wafer, a later probe test can also be conducted smoothly.

When a dividing step is included in the present invention, this step may be carried out after the annular protective member and outer circumferential excess region have been removed. This step can also be carried out without removing the annular protective member and outer circumferential excess region. Therefore, the dividing step can be carried out efficiently.

DETAILED DESCRIPTION OF PREFERRED EMBODIMENTS

Figure 1:
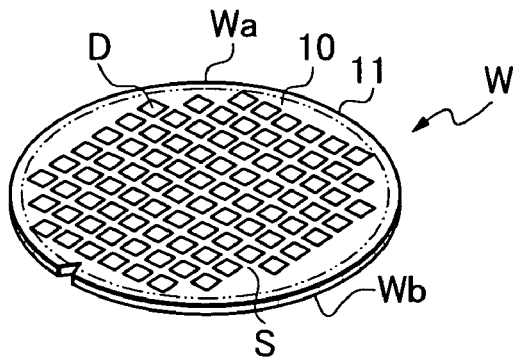
FIG. 1 is a perspective view showing an example of a wafer.

A wafer W shown in FIG. 1 is provided on an outer surface Wa thereof with a plurality of devices D, and, when streets S partitioning the devices are cut longitudinally and laterally, chips of individual devices are obtained. The outer (front) surface Wa of the wafer W includes a device region 10 on which the devices are formed, and an outer circumferential excess region 11 surrounding the device region and not provided with the devices thereon.

Figure 2:
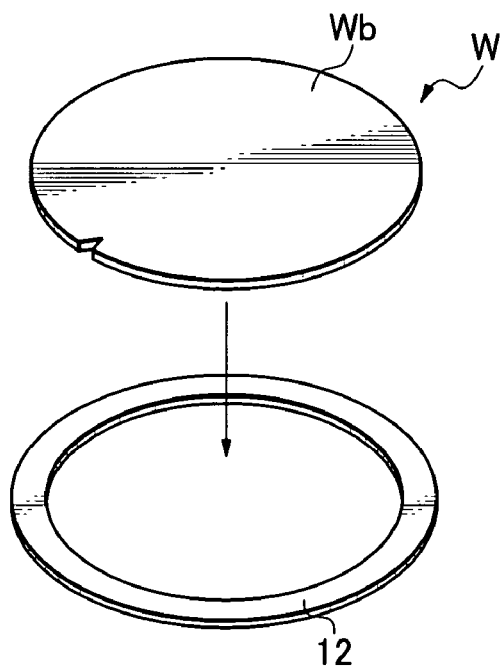
FIG. 2 is a perspective view showing the wafer and an example of an annular protective member.
Figure 3:
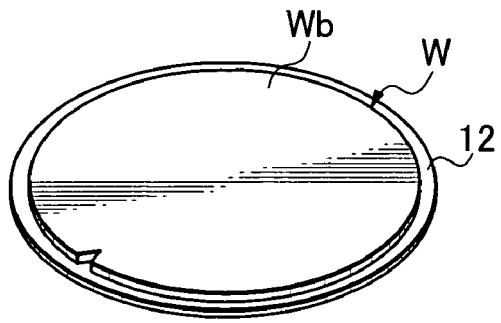
FIG. 3 is a perspective view showing the wafer to which the annular protective member is bonded.
Figure 4:
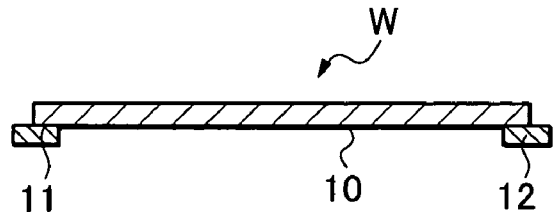
FIG. 4 is a sectional view showing the wafer to which the annular protective member is bonded.

In order to form the wafer W to a desired thickness, it is necessary to grind the rear surface. Before this step is carried out, an annular protective member 12 is bonded to the outer circumferential excess region 11 on the outer (front) surface Wa of the wafer W as shown in FIG. 2 in order to put the wafer W and annular protective member 12 in one united state (protective member bonding step) as shown in FIG. 3 and FIG. 4. An outer diameter of the annular protective member 12 may be equal to that of the wafer W, or larger than that of the wafer W by 2 to 3 mm. This bonding is carried out by, for example, an anodic bonding, a SOI bonding and a covalent bonding without using an adhesive agent. Since the wafer and annular protective member are combined with each other in one body without using an adhesive agent, it is unnecessary to peel off the annular protective member 12 in a later step, and adhesive residue is avoided.

When the anodic bonding is adopted, for example, the outer surface Wa of the wafer W and the surface to be bonded of the annular protective member 12 are provided with a mirror-like finishing in advance, and the resultant surfaces are superposed on each other and heated to around 200° C. to 300° C. while pressurizing the same. A high voltage of several hundred volts is applied between the wafer as a positive electrode and the annular protective member 12, and the two surfaces are chemically bonded with each other at an interface thereof by an electrostatic attractive force. It is not always necessary to perform mirror-like finishing to the whole of the outer surface Wa of the wafer W. At least the outer circumferential excess region 11 to which the annular protective member 12 is to be bonded may be provided with mirror-like finishing. It is possible to use glass and a ceramic material as the annular protective member 12 in case the bonding is carried out by the anodic bonding. Silicon can also be used as the annular protective member 12. In such a case, the bonding may occasionally not be achieved even though the surfaces are heated to a high temperature, and therefore, glass of a low melting point is coated on the surface to be bonded of the annular protective member 12. The outer circumferential excess region 11 of the wafer W and annular protective member 12 are subjected to anodic bonding via the low melting point glass.

When the SOI bonding is adopted, at least the surface of the outer circumferential excess region 11 of the wafer W and the surface to be bonded of the annular protective member 12 are provided with mirror-like finishing in advance, and a thin $SiO_2$ film is formed on the resultant surfaces. These surfaces are then bonded together via a hydroxyl group by annealing the surfaces at several hundred degrees Centigrade.

When the covalent bonding is adopted, at least the surface of the outer circumferential excess region 11 of the wafer W and the surface to be bonded of the annular protective member 12, the material of which is identical with that of the wafer W, are provided with mirror-like finishing, and both of these surfaces are fixed together under pressure at around 1000° C.

Figure 5:
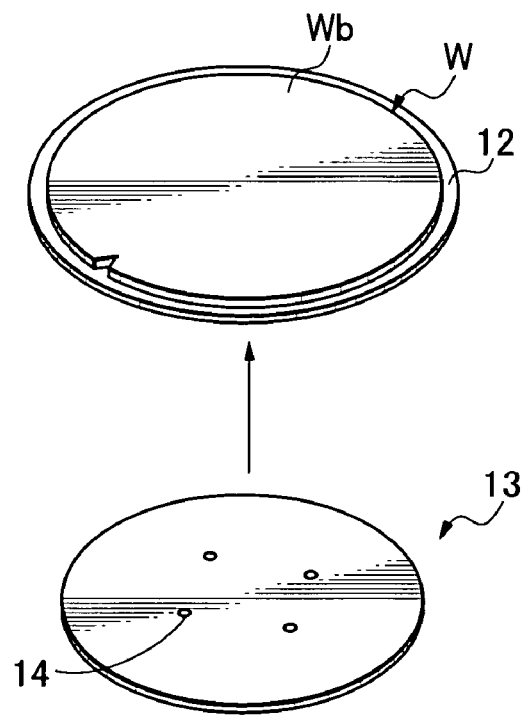
FIG. 5 is a perspective view showing the wafer to which the annular protective member is bonded and a dummy wafer.

After the wafer W and annular protective member 12 have thus been bonded together, a dummy wafer 13 is inserted into an inner circumferential side of the annular protective member 12 as shown in FIG. 5. The dummy wafer 13 has a thickness substantially equal to that of the annular protective member 12, and a tape having a tacking force is preferably pasted on an outer surface of the dummy wafer 13. It is preferable for the dummy wafer 13 to be provided with suction through holes 14, as shown in the illustrated example.

Figure 6:
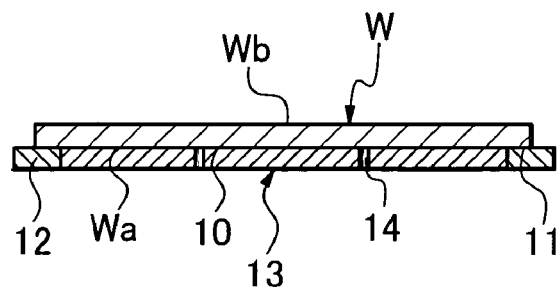
FIG. 6 is a sectional view of the dummy wafer held at an inner circumferential side of the annular protective member bonded to the wafer.
Figure 7:
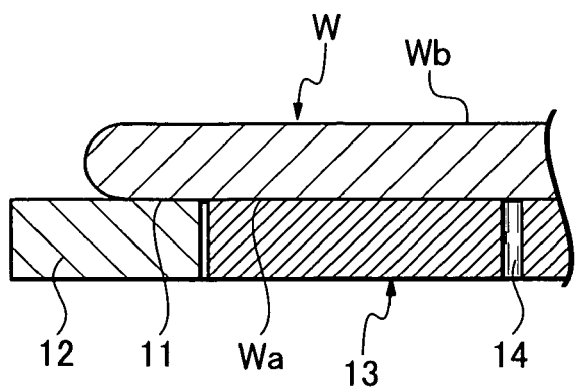
FIG. 7 is a partial enlarged sectional view of what is shown in FIG. 6.

When the dummy wafer 13 is inserted into the inner circumferential side of the annular protective member 12 and pasted therein, the dummy wafer 13 is put in the condition shown in FIG. 6. In this condition, the device regions 10 on the outer surface of the wafer Wa are protected by the dummy wafer 13. As shown in FIG. 7 on an enlarged scale, an outer circumferential surface of the wafer W is usually chamfered so that this surface becomes arcuate in cross-section.

Figure 8:
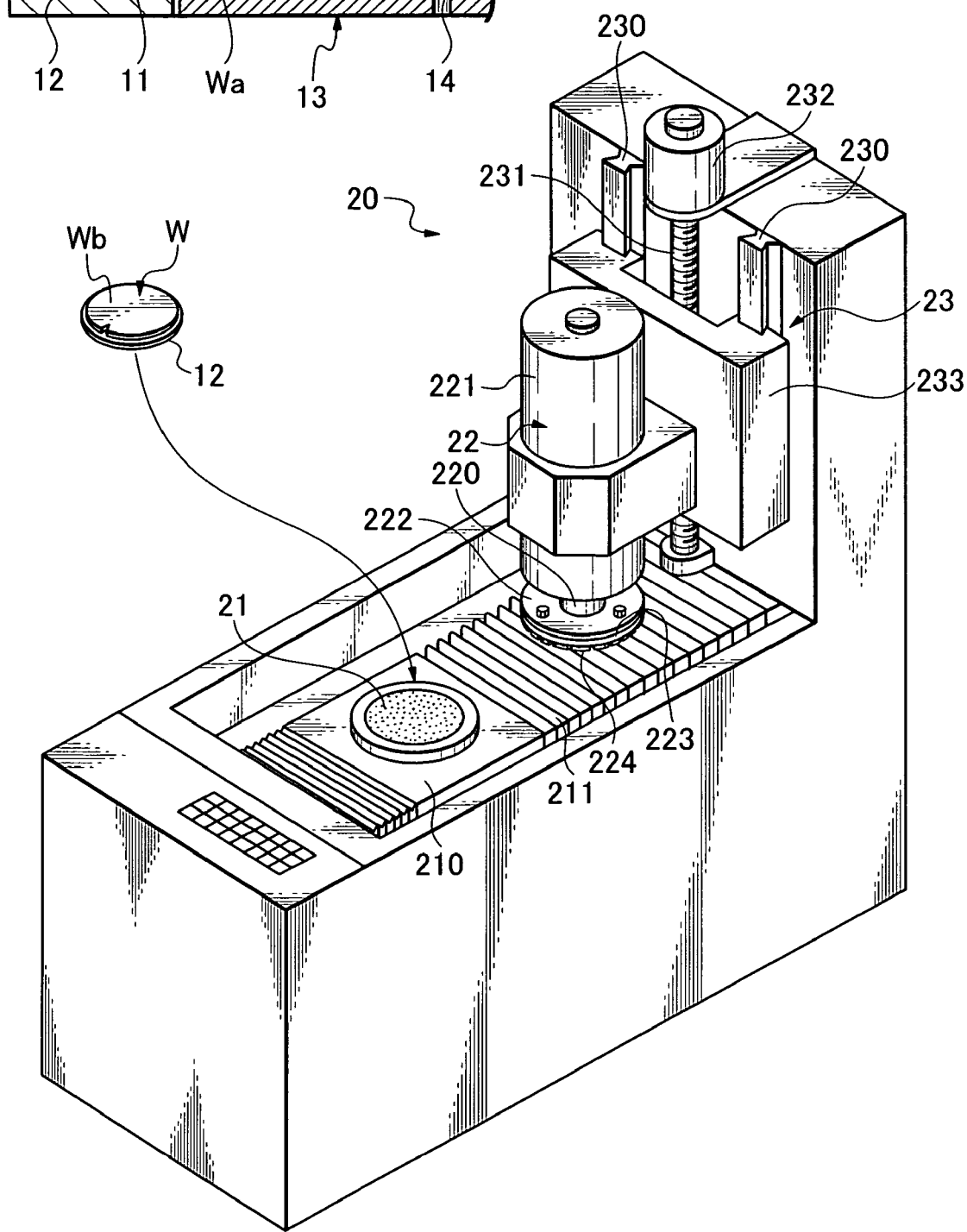
FIG. 8 is a perspective view showing an example of a grinding device.

As shown in FIGS. 6 and 7, the wafer W, on which the annular protective member 12 is bonded to the outer circumferential excess region 11 along with the dummy wafer 13 which has been inserted into the inner circumferential side thereof is ground at a rear surface Wb thereof by a grinding device 20 shown, for example, in FIG. 8. This grinding device 20 is provided with a wafer retaining chuck table 21, a means 22 for grinding the wafer retained by the chuck table 21, and a means 23 for feeding the grinding means 22.

The chuck table 21 is supported rotatably on a transfer base 210. As the transfer base 210 is moved horizontally in accordance with the expansion and contraction of bellows 211, the chuck table 21 is also moved in the same direction. In order to grind the rear surface Wb of the wafer W retained by the chuck table 21, the transfer base 210 is moved in accordance with the expansion and contraction of the bellows 211, and the wafer W is positioned just under the grinding means 22.

The grinding means 22 is provided with a spindle 220 having a vertical axis, a driving power source 221 connected to the spindle 220, a mounter 222 formed at a lower end of the spindle 220, and a grinding wheel 223 fixed to the mounter 222 Also, a grindstone 224 is fixed to a lower surface of the grinding wheel 223.

The feed means 23 includes vertically provided guide rail 230 and ball screw 231, a driving power source 232 connected to the ball screw 231, and a vertically movable member 233 slidably engaged with the guide rail 230 and screwed at an inner nut to the ball screw 231. The grinding means 22 is fixed to the vertically movable member 233. The vertically movable member 233 is driven by the driving power source 232 to cause the ball screw 231 to be turned. The vertically movable member 233 is moved up or down and guided by the guide rail 230 in accordance with the turning of the ball screw 231 driven by the driving power source 232. The grinding means 22 is also moved up and down in accordance with the vertical movement of the vertically movable member 233.

The wafer W, to which the annular protective member 12 is bonded, and into which the dummy wafer 13 is inserted, is held at its outer (front) surface on the chuck table 21, and positioned just under the grinding means 22 by the movement of the transfer base 210. The grinding means 22 is moved down as the grindstone 224 is rotated, and the grindstone 224 then contacts the rear surface Wb of the wafer W. The grinding operation is thereby carried out and the wafer W is formed to a desired thickness (rear surface grinding step). During the grinding operation, the outer circumferential excess region 11 of the wafer W is supported on the annular protective member 12, and the device regions 10 are protected by the dummy wafer 13.

Figure 9:
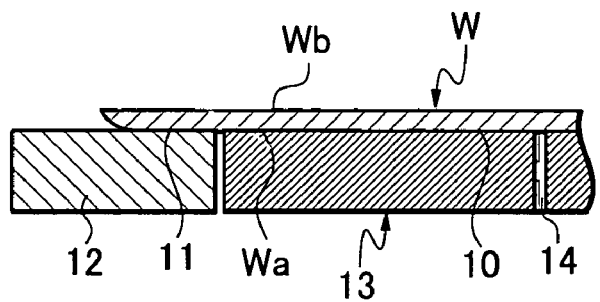
FIG. 9 is a partial enlarged sectional view showing the annular protective member in which the rear surface-ground wafer and dummy wafer are held.
Figure 10:
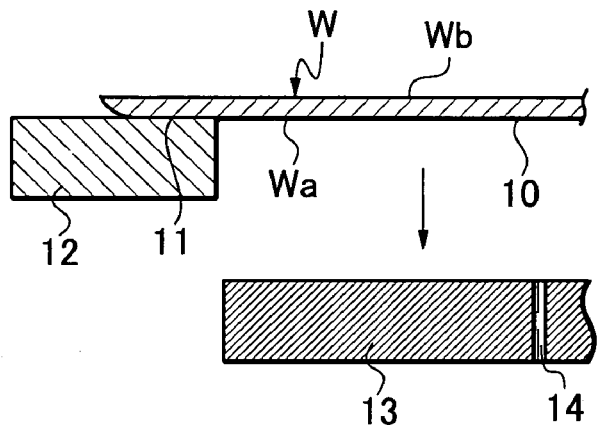
FIG. 10 is a partial enlarged sectional view showing the state of the dummy wafer removed from the annular protective member.

As shown in FIG. 9, forming the wafer W to a desired thickness by grinding causes the outer circumference to become sharpened. As shown in FIG. 10, the dummy wafer 13 is removed, and the process then advances to a subsequent step.

Figure 11:
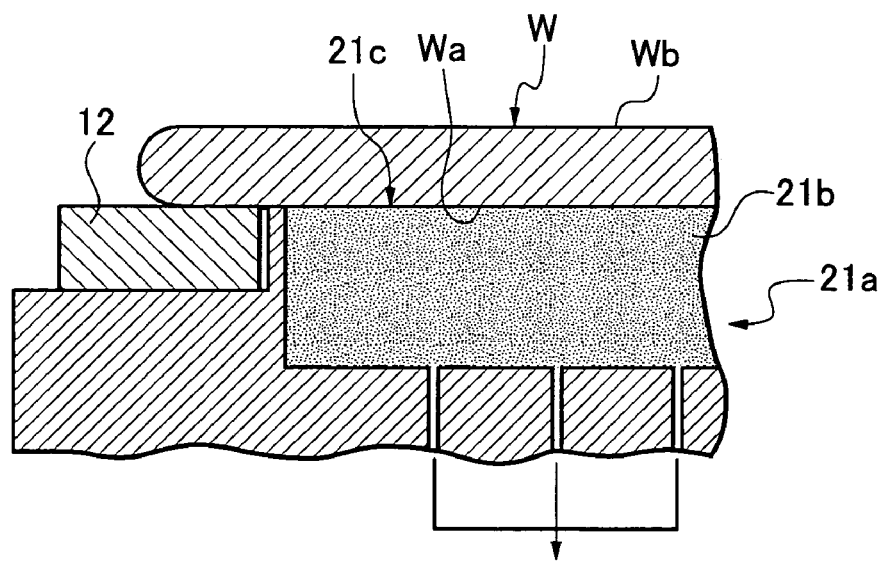
FIG. 11 is a partial enlarged sectional view showing the state of the wafer retained by a projection-carrying chuck table.

As shown in FIG. 11, the chuck table 21a has a projection 21c including a suction portion 21b communicating with a suction power source. When the height of the projection 21c and the thickness of the annular protective member 12 are equal to each other, the annular protective member 12 is engaged with the projection 21c, so that an upper surface of the annular protective member 12 and that of the projection 21c become flush with each other. The grinding of the wafer W is carried out with the wafer W supported on this surface. Therefore, a dummy wafer becomes unnecessary in this case.

Figure 12:
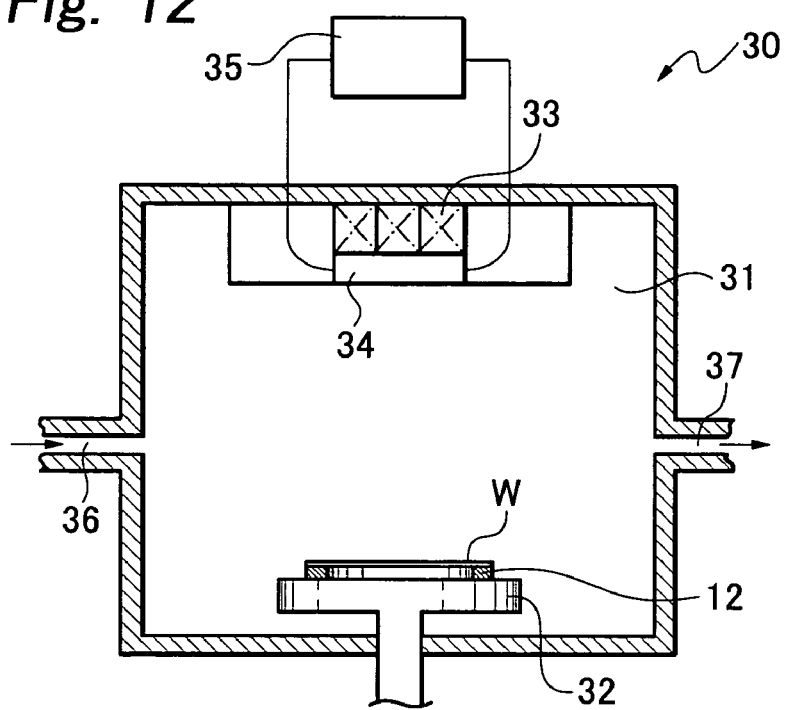
FIG. 12 is a sectional view showing an example of a film forming device.

The wafer W is then coated at the rear surface Wb thereof with a metal film made of gold, silver and titanium (film forming step). In the film forming step, a vacuum film forming device 30 shown, for example, in FIG. 12 is used. In this film forming unit 30, a retainer 32 for retaining the wafer electrostatically is provided in a spatter chamber 31. In the upper side of and opposed to the retainer 32 in the spatter chamber 31, a spattering (sputtering) source 34 made of a metal is provided in a state of being supported on an excitation member 33. A high frequency power source 35 is connected to this spattering source 34. The spatter chamber 31 is provided at one side portion thereof with a spattering gas introduction port 36, and at the other side portion thereof with a vacuum port 37 communicating with a vacuum source.

Figure 13:
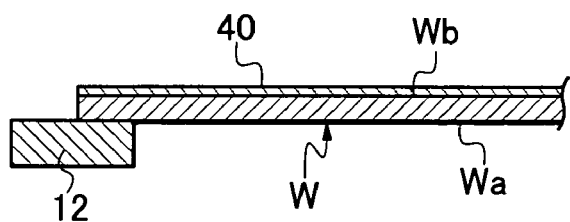
FIG. 13 is a partial enlarged sectional view showing the wafer, a rear surface of which is coated with a metal film, and the annular protective member.

Since the portion on the side of the annular protective member 12 is retained electrostatically on the retainer 32, the rear surface of the wafer W is retained in an opposed condition with respect to the spattering source 34. High frequency electric power of around 40 kHz is then applied from the high frequency power source 35 to the spattering source 34 magnetized by the excitation member 33. Thus, the interior of the spattering chamber 31 is vacuumed to around $10^{-2}$ Pa to $10^{-4}$ Pa through the vacuum port 37 and thus a vacuum atmosphere is created in the interior of the spattering chamber. When an argon gas is simultaneously introduced from the introduction port 36 to cause plasma to occur, argon ions in the plasma impinge upon the spattering source 34, and particles are sprung out and deposited on the rear surface of the wafer W. As a result, a metal film 40 is formed on the rear surface Wb of the wafer W as shown in FIG. 13 (film forming step). The film forming step is carried out in a state after the wafer W has become thinner due to the grinding operation. Nonetheless, since the wafer W is left bonded as one body with the annular protective member 12, handling becomes easy even though the wafer has lost rigidity. Moreover, since the annular protective member and wafer W are bonded together without using adhesive agent, the bonding state of the two is stable even when the temperature in the interior of the spattering chamber 31 becomes high, and thus the formation of the metal film can be carried out smoothly. The film forming step may also be carried out by utilizing evaporation and CVD. In the film forming step, a dummy wafer may be inserted into the inner circumferential side of the annular protective member 12, and the retainer 32 may be formed so as to have a projection in the same manner as the chuck table shown in FIG. 11.

Figure 14:
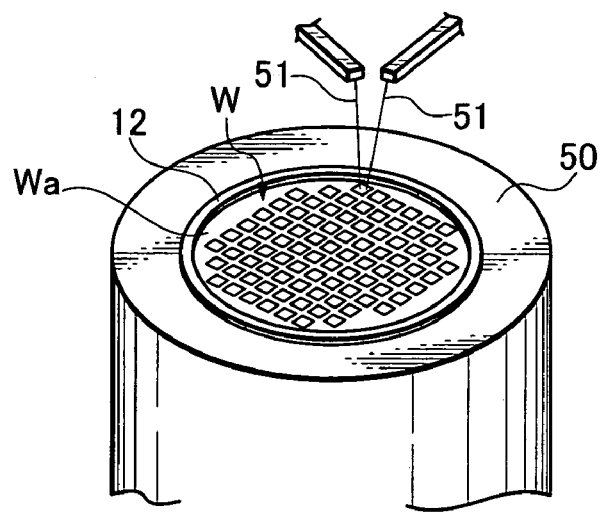
FIG. 14 is a perspective view showing an example of a test step.

As shown in FIG. 14, the electric characteristics of each device are tested by retaining the wafer by the rear surface thereof on which a metal film was formed. While on the retainer table 50 probes 51 are brought into contact with the device to be tested on the side of the outer (front) surface (testing step). At this time, the retainer table 50 is connected to the earth (ground), and the wafer W is thereby connected to the earth (ground) via the metal film 50. Since the testing step is also carried out with the annular protective member 12 and wafer W left bonded together in one body, handling of the wafer is easy, and the testing work can be carried out smoothly.

Figure 15:
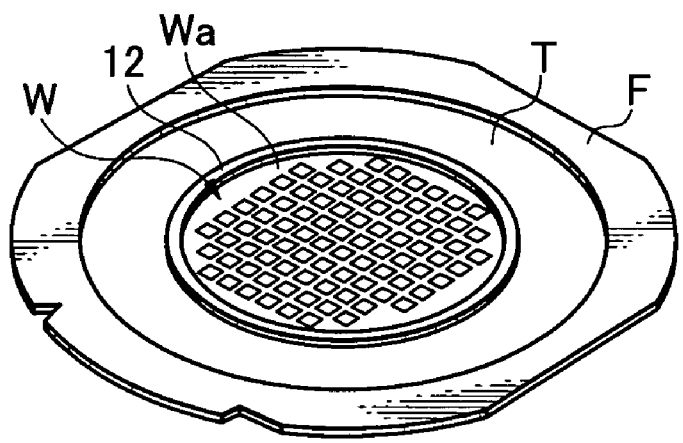
FIG. 15 is a perspective view showing the condition of the wafer, in which a metal film is formed on the rear surface thereof to which the annular protective member is bonded, combined with a frame in one body via a tape.
Figure 16:
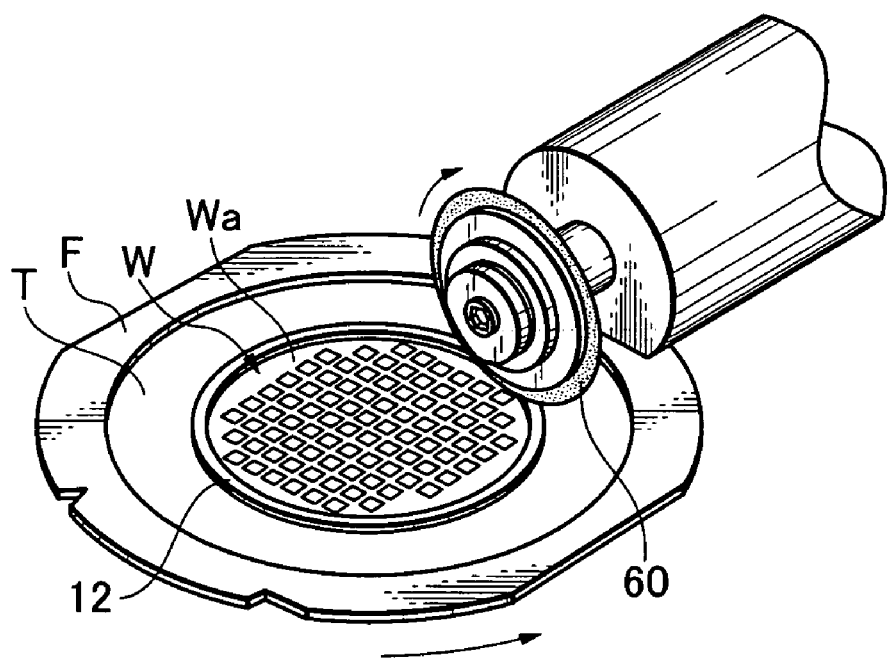
FIG. 16 is a perspective view showing an example of an outer circumferential excess region separating step.
Figure 17:
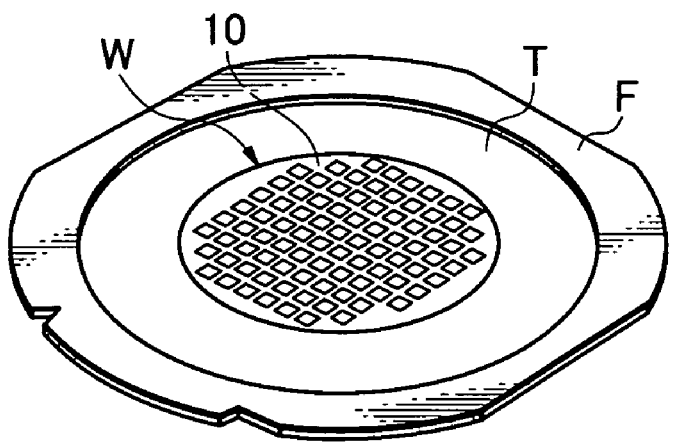
FIG. 17 is the wafer, from which an outer circumferential excess region and the annular protective member have been removed, combined with the frame in one body via a tape.

After the testing step is finished, the rear surface Wb on which the metal film 50 is formed is affixed on an adhesive surface of a tape T on the outer circumferential portion of which the frame F is affixed, thereby placing the outer (front) surface Wa of the wafer W in an exposed state as shown in FIG. 15. As shown in FIG. 16, the wafer W combined with the frame F in one body via the tape T is rotated, and a cutting blade 60 rotated at a high speed is moved into the inner side of the annular protective member 12 only to such an extent that the tape T is not cut. The wafer W is thereby cut along an inner circumference of the annular protective member 12. Such a cutting operation is carried out to remove the outer circumferential excess region 11 and annular protective member 12. The outer circumferential excess region 11 and annular protective member 12 are removed by thus carrying out the cutting operation. As a result, the outer circumferential excess region 11 of the wafer W is separated as shown in FIG. 17, and the wafer is combined in one body with the frame F with only the device region 10 left pasted on the tape T (outer circumferential excess region separating step).

Figure 18:
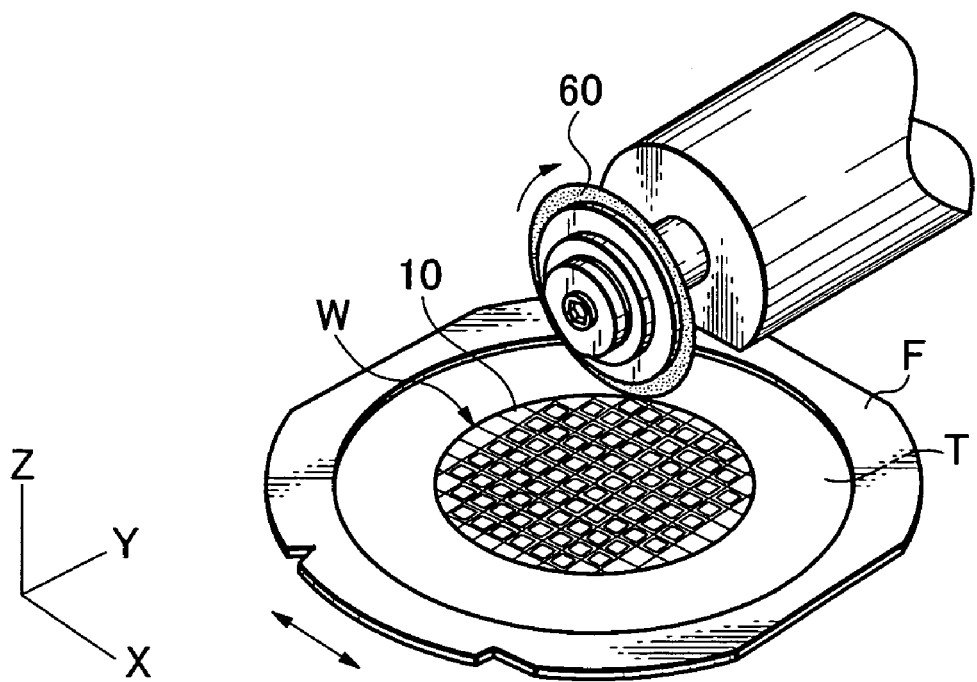
FIG. 18 is a perspective view showing an example of a dividing step.

The wafer W is then moved in the direction of the X-axis as shown in FIG. 18, and the cutting blade 60 is rotated at a high speed to cut into the street of the wafer W and moved longitudinally and laterally to divide the wafer into parts having individual devices.

Figure 19:
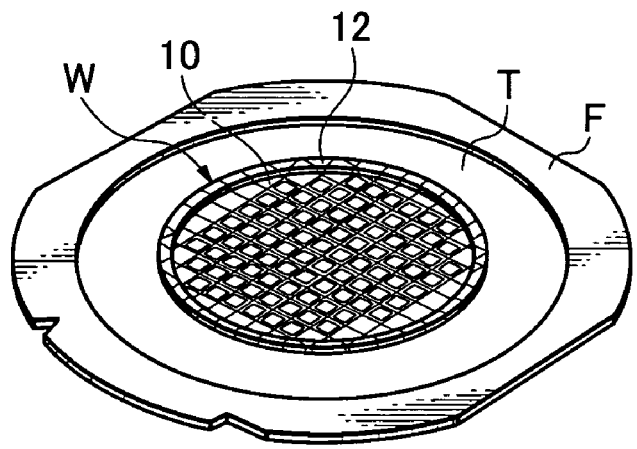
FIG. 19 is a perspective view showing another example of a dividing step.

When the wafer including the outer circumferential excess region 11 and annular protective member 12 is cut off longitudinally and laterally as shown in FIG. 19, the outer circumferential excess region separating step is not necessary. In this case, the devices constituting the device region 10 may be picked up independently of the outer circumferential excess region 11 and annular protective member 12 and thus the wafer can be handled efficiently.

Figure 20:
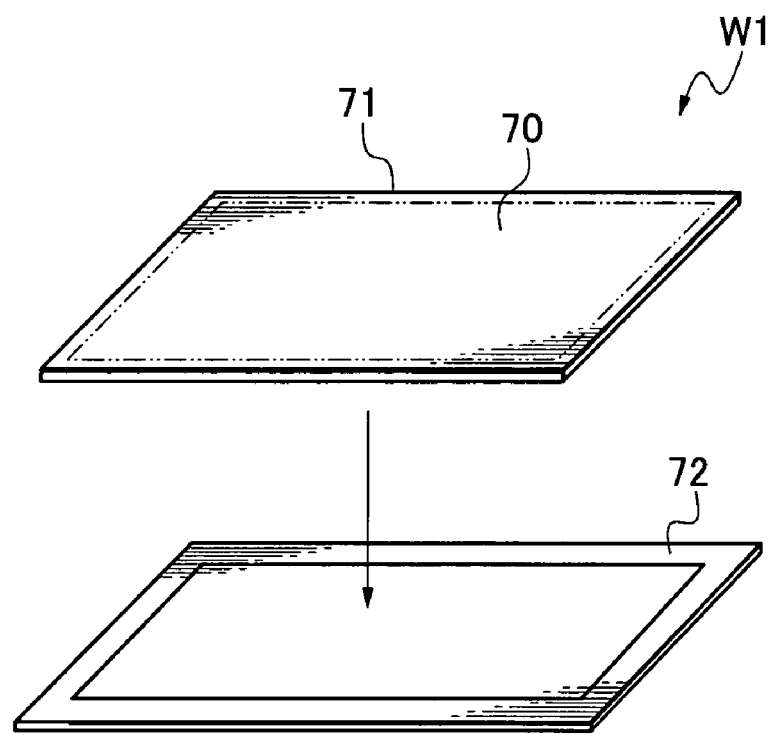
FIG. 20 is a perspective view showing a rectangular wafer and an annular protective member corresponding thereto.

In the above statement, the processing of a substantially circular wafer is taken as an example and described. The present invention can also be applied to a case where a rectangular wafer is processed. For example, when a rectangular wafer W1 has a rectangular device region 70 and an outer circumferential excess region 71 surrounding the rectangular device region 70 as shown in FIG. 20, an annular protective member 72 is formed to have a shape which corresponds to the outer circumferential excess region 71 and is bonded to the outer circumferential excess region 71 in a protective member bonding step. A rear surface grinding step, a film forming step and a testing step are carried out in the same manner as in the case of the processing of the circular wafer. When an outer circumferential excess region separating step is carried out, a cutting operation is carried out linearly along an inner circumference of the annular protective member 72 as the wafer W1 is moved in the X-axis direction. The wafer W1 is cut linearly in the same manner when turned 90 degrees. As a result, the outer circumferential excess region 71 and annular protective member 72 can be removed. When the outer circumferential excess region separating step is not carried out, the outer circumferential excess region 71 and annular protective member 72 are cut off with respect to the device region 70 in the same manner as in the case of the processing of the circular wafer.

According to the present invention, the outer circumference of the wafer is reinforced with an annular protective member, so that the handling of the wafer becomes easy during the processing thereof. The present invention can be utilized, especially, for the processing of a thinly formed wafer.

What is claimed is:

1. A method of processing a wafer with a grinding device having a chuck table, the wafer having a front surface and a rear surface, the front surface including both a device region on which a plurality of devices are formed and an outer region surrounding the device region, said method comprising:

bonding an annular protective member to the front surface of the wafer in the outer region of the front surface, wherein the annular protective member includes a vacant center portion;

grinding the rear surface of the wafer while retaining the wafer on the chuck table of the grinding device so that the front surface of the wafer faces the chuck table via the annular protective member bonded to the outer region on the front surface of the wafer;

dividing the wafer into individual parts in such a manner as to separate the device region into the plurality of devices; and cutting the wafer along an inner circumference of the annular protective member and separating the outer region from the device region, said cutting of the wafer and said separating of the outer region being carried out prior to said dividing of the wafer.

2. A method of processing a wafer according to claim 1, wherein said bonding comprises bonding the annular protective member to the outer region without using any adhesive agent such that the annular protective member and the wafer form one body.

3. A method of processing a wafer according to claim 2, wherein said bonding comprises one of anodic bonding, SOI bonding and covalent bonding.

4. A method of processing a wafer according to claim 1, further comprising forming a film on the rear surface of the wafer and conducting a probe test on the devices, said forming of the film and said conducting of the probe test being carried out after both said bonding of the annular member to the front surface of the wafer and said grinding of the rear surface of the wafer.

5. A method of processing a wafer according to claim 1, wherein the protective member is formed out of one of glass, silicon and a ceramic material.

6. A method of processing a wafer according to claim 2, further comprising forming a film on the rear surface of the wafer and conducting a probe test on the devices, said forming of the film and said conducting a probe test being carried out after both said bonding of the annular member to the front surface of the wafer and said grinding of the rear surface of the wafer.

7. A method of processing a wafer according to claim 3, further comprising forming a film on the rear surface of the wafer and conducting a probe test on the devices, said forming of the film and said conducting of the probe test being carried out after both said bonding of the annular member to the front surface of the wafer and said grinding of the rear surface of the wafer.

8. A method of processing a wafer according to claim 1, wherein each of the wafer and the annular protective member has a circular shape.

9. A method of processing a wafer according to claim 8, wherein the annular protective member has an outer diameter greater than that of the wafer.

10. A method of processing a wafer according to claim 1, wherein each of the wafer and the annular protective member has a rectangular shape.

11. A method of processing a wafer according to claim 1, wherein the annular protective member has a continuous ring shape.

12. A method of processing a wafer according to claim 1, wherein the annular protective member has a rectangular cross-sectional shape.

13. A method of processing a wafer according to claim 1, wherein the annular protective member is made of the same material as the wafer.

* * * * *